United States Patent
Yamazaki

(10) Patent No.: US 10,751,889 B2
(45) Date of Patent: Aug. 25, 2020

(54) ROBOT

(71) Applicant: Seiko Epson Corporation, Tokyo (JP)

(72) Inventor: Takema Yamazaki, Fujimi (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 16/585,005

(22) Filed: Sep. 27, 2019

(65) Prior Publication Data

US 2020/0101627 A1 Apr. 2, 2020

(30) Foreign Application Priority Data

Sep. 28, 2018 (JP) .................................. 2018-183521

(51) Int. Cl.
| | |
|---|---|
| *B25J 19/00* | (2006.01) |
| *B25J 9/00* | (2006.01) |
| *H05K 7/20* | (2006.01) |
| *H05K 7/14* | (2006.01) |
| *B25J 9/12* | (2006.01) |

(52) U.S. Cl.
CPC ......... *B25J 19/0054* (2013.01); *B25J 9/0009* (2013.01); *B25J 9/12* (2013.01); *H05K 7/1427* (2013.01); *H05K 7/2039* (2013.01); *H05K 7/20172* (2013.01)

(58) Field of Classification Search
CPC ........ B25J 9/0009; B25J 9/12; B25J 19/0054; H05K 7/1427; H05K 7/20172; H05K 7/2039
See application file for complete search history.

(56) References Cited

U.S. PATENT DOCUMENTS

| | | | |
|---|---|---|---|
| 6,208,510 B1* | 3/2001 | Trudeau | H05K 7/20609 165/80.3 |
| 2007/0091564 A1* | 4/2007 | Malone | H05K 7/20727 361/695 |
| 2010/0061052 A1* | 3/2010 | Chung | G06F 1/20 361/679.47 |
| 2017/0008176 A1* | 1/2017 | Wiley | B25J 19/0054 |
| 2017/0055359 A1* | 2/2017 | Teranaka | H05K 7/1482 |
| 2017/0187263 A1* | 6/2017 | Yamamoto | H02K 9/04 |
| 2017/0191822 A1* | 7/2017 | Becker | G01B 11/002 |
| 2017/0203445 A1* | 7/2017 | Owa | B25J 19/0054 |
| 2017/0252007 A1* | 9/2017 | Mine | G01S 15/8927 |
| 2018/0093376 A1* | 4/2018 | Teranaka | B25J 9/044 |
| 2018/0370048 A1* | 12/2018 | Yoon | B25J 18/02 |
| 2019/0380222 A1* | 12/2019 | Tagashira | H02B 1/28 |

FOREIGN PATENT DOCUMENTS

| | | |
|---|---|---|
| JP | 2002-239970 A | 8/2002 |
| JP | 2015-136780 A | 7/2015 |

* cited by examiner

*Primary Examiner* — Jacob R Crum
(74) *Attorney, Agent, or Firm* — Harness, Dickey & Pierce, P.L.C.

(57) ABSTRACT

A robot includes a robot main body section including a base and a robot arm coupled to the base and including a sealed internal space, a driving section provided on the inside of the robot arm and configured to drive the robot arm, a control board provided on the inside of the base, a power supply board provided on the inside of the base and configured to supply electric power to the control board, a driving board provided on the inside of the robot arm and configured to drive the driving section based on a signal from the control board, a fan configured to stir gas on the inside of the robot main body section, and a heat sink provided on the inside of the base.

5 Claims, 12 Drawing Sheets

ROBOT

The present application is based on, and claims priority from, JP Application Serial Number 2018-183521, filed Sep. 28, 2018, the disclosure of which is hereby incorporated by reference herein in its entirety.

BACKGROUND

1. Technical Field

The present disclosure relates to a robot.

2. Related Art

An industrial robot that performs various kinds of work on a work object on behalf of a human has been used. As an example of such an industrial robot, there is known, for example, a robot including a base, a robot arm provided turnably with respect to the base, and a motor provided in the robot arm to drive the robot arm. In general, a robot controller provided separately from the robot is coupled to the robot. The robot arm is driven by driving the motor with the robot controller. Consequently, the robot can perform various kinds of work on a work object.

In the robot controller, in general, a power supply board that supplies electric power to the motor and a control board that controls the driving of the motor are provided. The control board is likely to malfunction because of the influence of heat due to the power supply board, which is a heat generation source. In order to solve this problem, for example, JP-A-2015-136780 (Patent Literature 1) discloses a structure that discharges heat in a robot controller to the outside of the robot controller with a fan.

In recent years, development of a robot capable of performing work in a clean room has been performed. For example, JP-A-2002-239970 (Patent Literature 2) discloses a structure that seals the inside of a robot in order to realize waterproof performance and dustproof performance.

However, when the robot that works in the clean room and the robot controller are integrally formed, since the inside of the robot is sealed, an opening cannot be provided. Heat exhaust of the robot controller cannot be sufficiently performed.

SUMMARY

A robot according to an aspect of the present disclosure includes: a robot main body section including a base and a robot arm coupled to the base and including a sealed internal space; a driving section provided on an inside of the robot arm and configured to drive the robot arm; a control board provided on an inside of the base; a power supply board provided on the inside of the base and configured to supply electric power to the control board; a driving board provided on the inside of the robot arm and configured to drive the driving section based on a signal from the control board; a fan configured to stir gas on an inside of the robot main body section; and a heat sink provided on the inside of the base.

In the robot, the fan may overlap the heat sink in a plan view from an axial direction of a rotation axis of the fan.

In the robot, a wind tunnel section including an opening in the axial direction of the rotation axis and covering the control board or the power supply board may be provided in the base, and the fan may overlap the opening in the axial direction of the rotation axis.

In the robot, the heat sink may include a tabular section and a plurality of projecting sections projecting from the tabular section, and the plurality of projecting sections may be radially arranged.

In the robot, the fan may overlap a heat generating section provided on the control board or the power supply board in a plan view from an axial direction of a rotation axis.

DESCRIPTION OF EXEMPLARY EMBODIMENTS

A robot according to the present disclosure is explained in detail below based on embodiments shown in the accompanying drawings.

First Embodiment

Basic Configuration of a Robot

Figure 1:
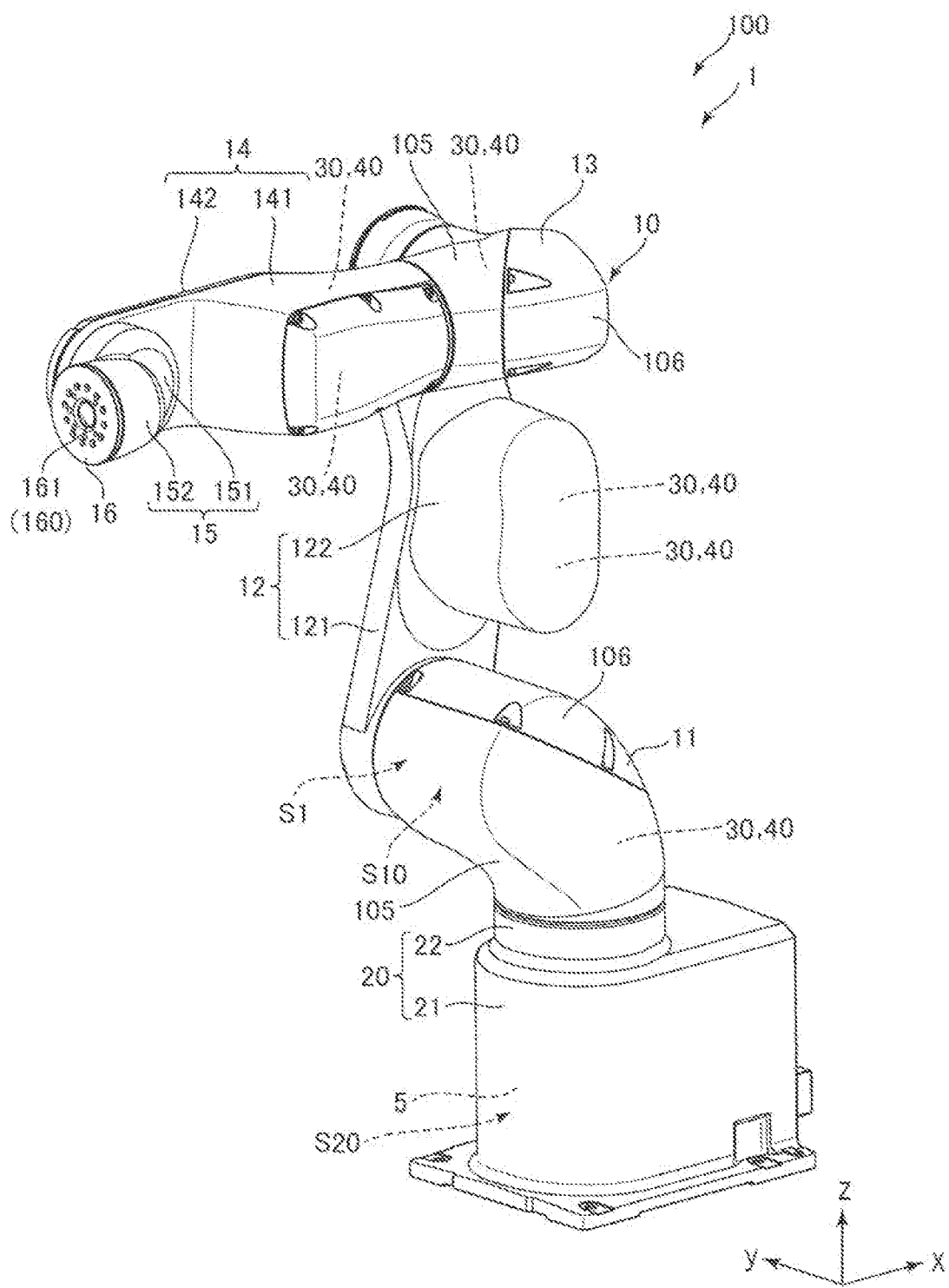
FIG. 1 is a perspective view showing a robot according to a first embodiment.
Figure 2:
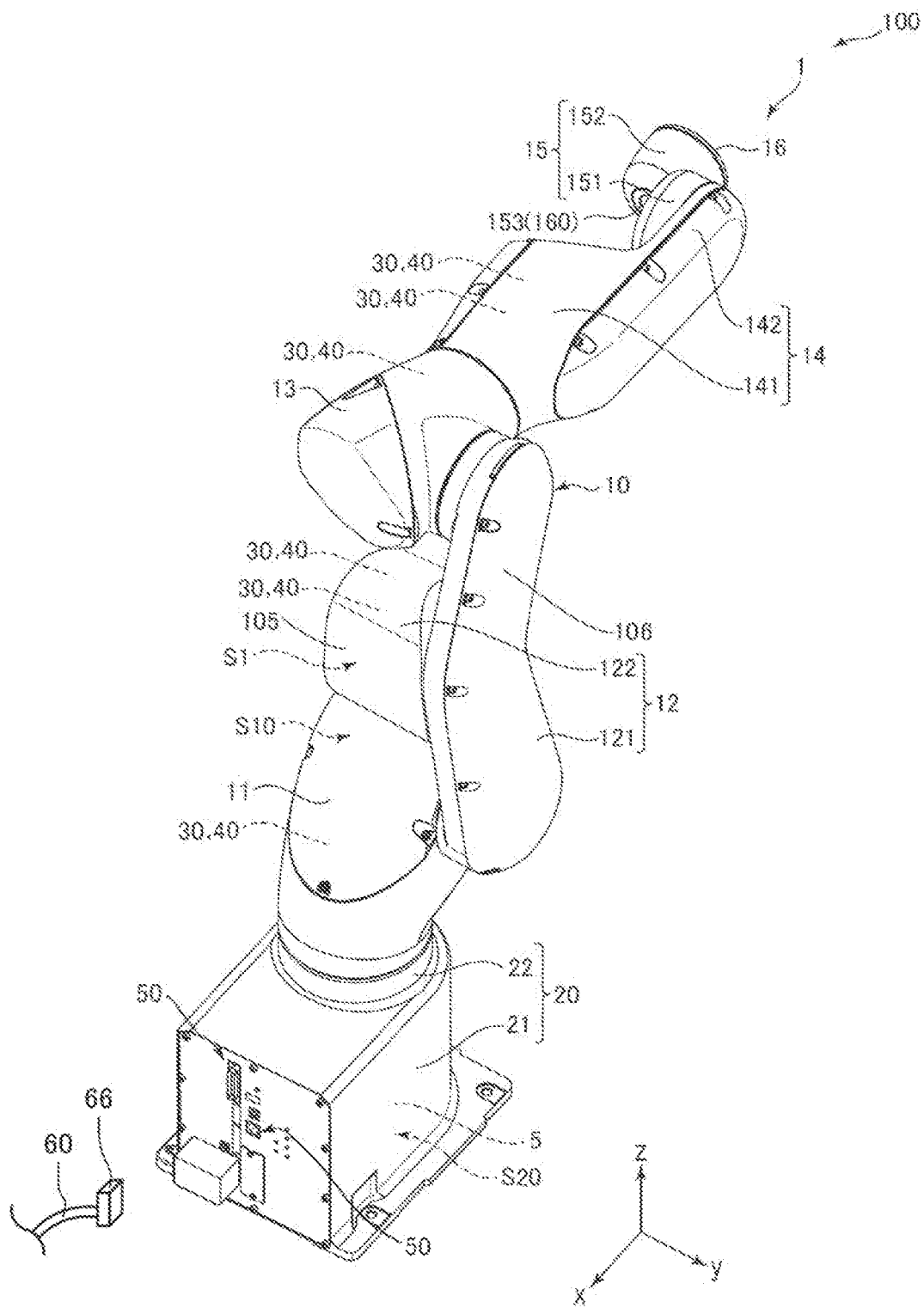
FIG. 2 is a perspective view of the robot shown in FIG. 1 viewed from a direction different from a direction in FIG. 1.
Figure 3:
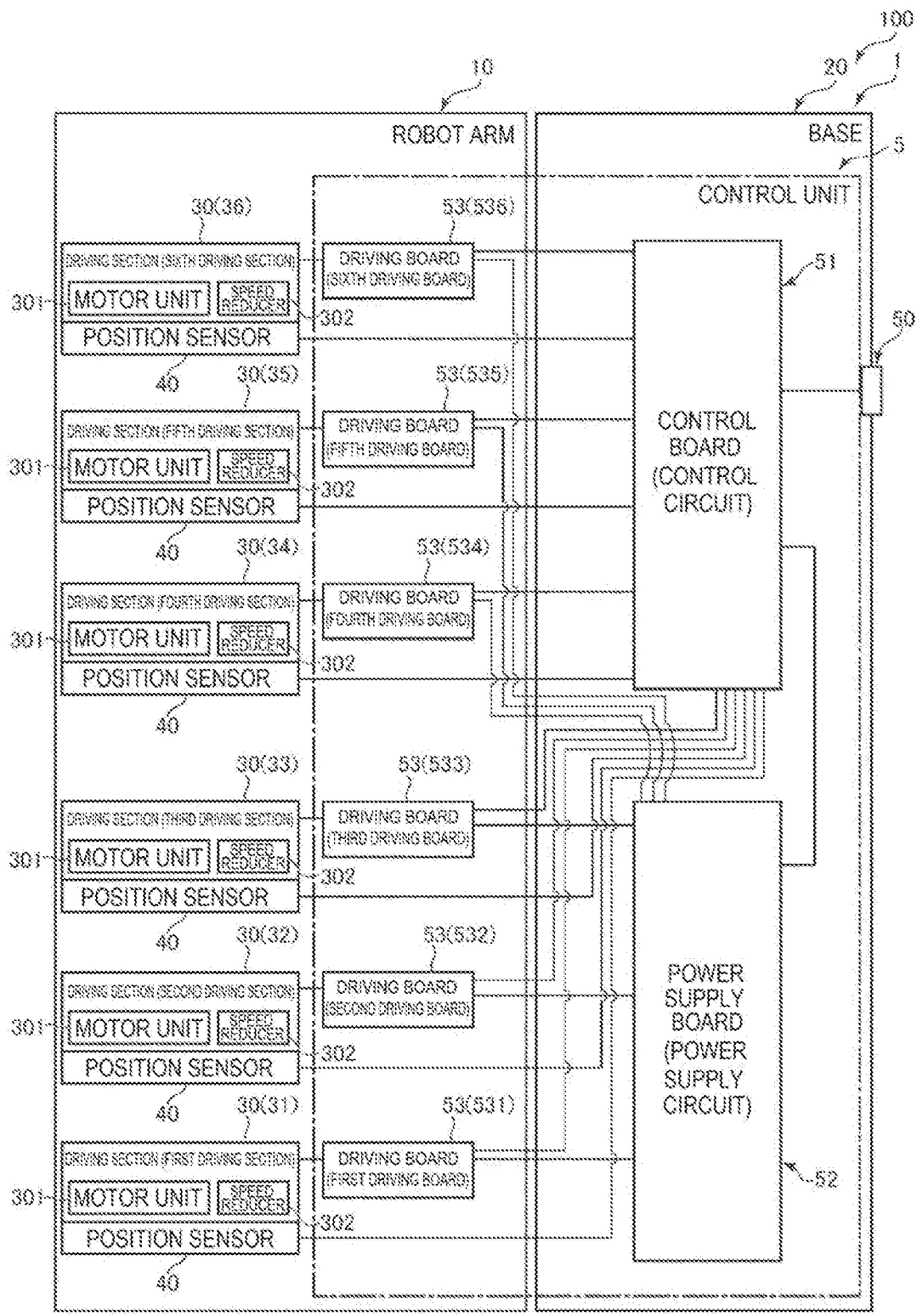
FIG. 3 is a system block diagram of the robot shown in FIG. 1.

FIG. 1 is a perspective view showing a robot according to a first embodiment. FIG. 2 is a perspective view of the robot shown in FIG. 1 viewed from a direction different from a direction in FIG. 1. FIG. 3 is a system block diagram of the robot shown in FIG. 1. In the following explanation, for convenience of explanation, in each of FIGS. 1 and 2, an x axis, a y axis, and a z axis are shown as three axes orthogonal to one another. A distal end side of arrows indicating the axes is represented as "+" and a proximal end side of the arrows is represented as "−" (the same applies in FIGS. 4 to 9, 12, and 13 referred to below). A direction parallel to the x axis is referred to as "x-axis direction", a direction parallel to the y axis is referred to as "y-axis direction", and a direction parallel to the z axis is referred to as "z-axis direction". A base 20 side of a robot 100 shown in FIG. 1 is referred to as "proximal end" and the opposite side of the base 20 side (an arm 16 side) is referred to as "distal end".

In this specification, "horizontal" includes inclination within a range of ±5° or less with respect to a horizontal. Similarly, "vertical" includes inclination within a range of ±5° or less with respect to a vertical. "Parallel" includes not only a complete parallel of two lines (including axes) or surfaces but also inclination of the two lines or the surfaces at ±5° or less. "Orthogonal" includes not only crossing of two lines (including axes) or surfaces at an angle of 90° but also inclination of the two lines or the surfaces at ±5° or less with respect to 90°.

A robot 100 shown in FIGS. 1 and 2 is a so-called six-axis vertical articulated robot. The robot 100 can be used in, for example, a manufacturing process for manufacturing a precision instrument and the like such as a wristwatch. The robot 100 can be suitably used under a high-cleanness environment. The robot 100 can be suitably used under an environment of a cleanness class of Class 3 or more based on the International Standard ISO 14644-1:2015.

In the following explanation, first, a basic configuration of the robot 100 is explained.

The robot 100 includes a robot main body section 1 and a plurality of driving sections 30, a plurality of position sensors 40, and a control unit 5 (a control device) incorporated in the robot main body section 1. The robot 100 includes a plurality of external coupling sections 50 (e.g., connectors). For example, electric power is supplied to the robot 100 by electrically coupling the external coupling sections 50 to an external power supply (not shown in FIGS. 1 and 2). Consequently, the robot 100 can be driven.

In this specification, a posture of the robot 100 shown in FIG. 1 (the same posture in FIG. 2 and FIGS. 4 to 8 referred to below) is represented as "basic posture". In the following explanation, for convenience of explanation, unless specifically noted otherwise, explanation concerning disposition relations and the like of sections of the robot 100 is based on the robot 100 in a stationary state in the basic posture.

Robot Main Body Section

The robot main body section 1 includes, as shown in FIGS. 1 and 2, a base 20 and a robot arm 10 coupled to the base 20. As explained in detail below, the robot main body section 1 includes a plurality of exterior members (a plurality of housings 105, a plurality of covers 106, etc.) and includes an internal space S1 for housing the plurality of driving sections 30, the plurality of position sensors 40, and the control unit 5. The internal space S1 (a first internal space) includes the inside of the base 20, that is, an internal space S20 (a third internal space) and the inside of the robot arm 10, that is, an internal space S10 (a second internal space). The internal space S10 and the internal space S20 communicate.

The sections of the robot main body section 1 are explained below.

Base

The base 20 is a portion for attaching the robot 100 to any setting place. A setting place of the base 20 is not particularly limited and may be, for example, a floor, a wall, a ceiling, a workbench, or a movable truck. The base 20 includes a main body section 21, an external shape of which is formed in a rectangular parallelepiped shape, and a protruding section 22 provided on the +z-axis side of the main body section 21 and having a columnar external shape.

Figure 7:
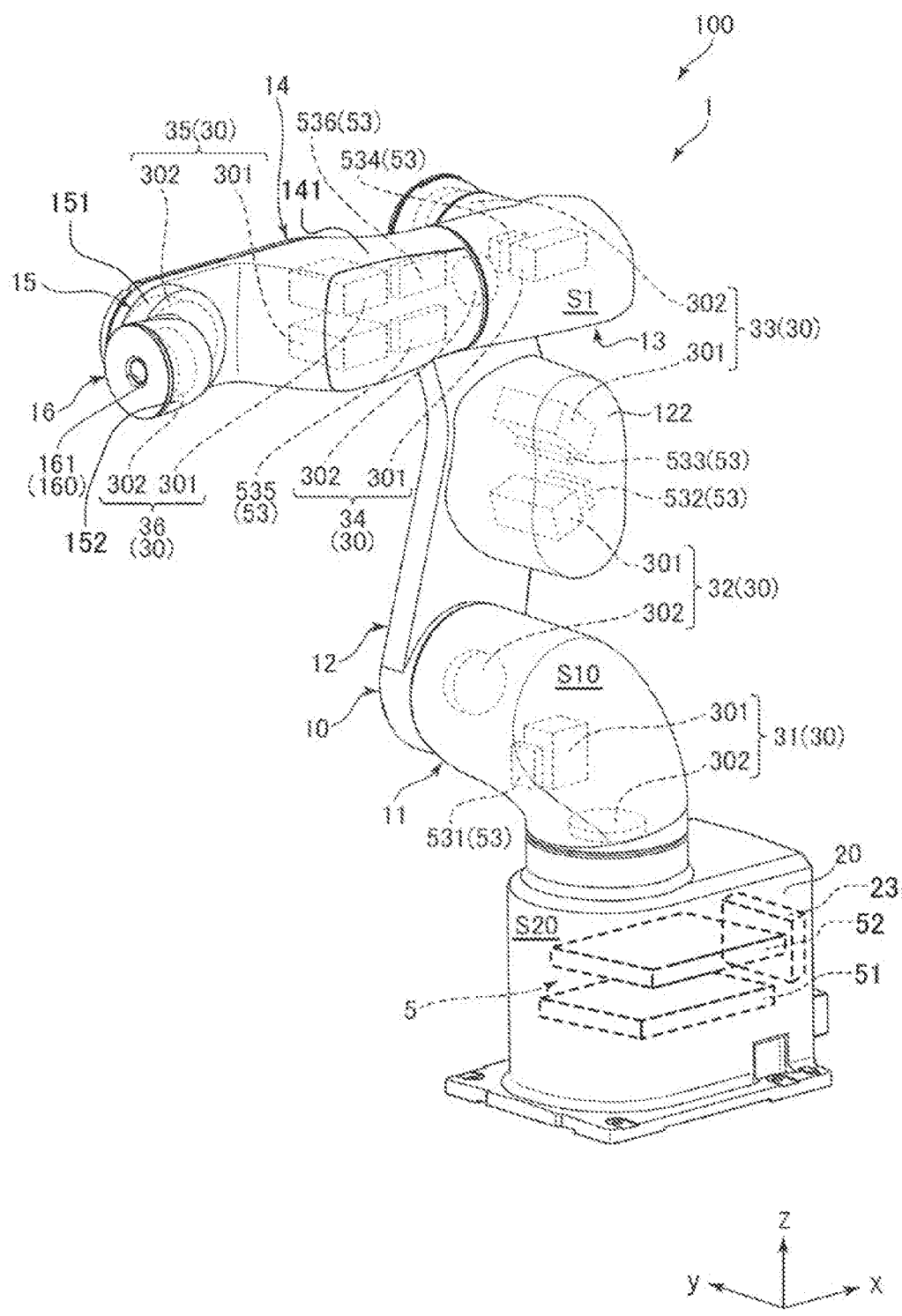
FIG. 7 is a perspective view schematically showing the inside of a robot main body section included in the robot shown in FIG. 1.

As shown in FIG. 7, a control board 51, a power supply board 52 that supplies electric power to the control board 51, and a cooling mechanism 23 that cools the control board 51 and the power supply board 52 are disposed on the inside of the base 20. Details are explained below.

Robot Arm

The robot arm 10 is turnably supported by the base 20 and includes an arm 11 (a first arm), an arm 12 (a second arm), an arm 13 (a third arm), an arm 14 (a fourth arm), an arm 15 (a fifth arm), and an arm 16 (a sixth arm, a distal end arm). The arms 11 to 16 are coupled in this order from the proximal end side toward the distal end side and configured to be relatively turnable with respect to the adjacent arms on the proximal end side or the base 20. Although not shown in detail, in this embodiment, the arms 11 to 16 each include the exterior member (the housing 105, the cover 106, etc.) and a supporting member (not shown in FIGS. 1 and 2) provided on the inner circumferential surfaces of the exterior members and including bearings (not shown in FIGS. 1 and 2) coupled to the driving sections 30.

Figure 4:
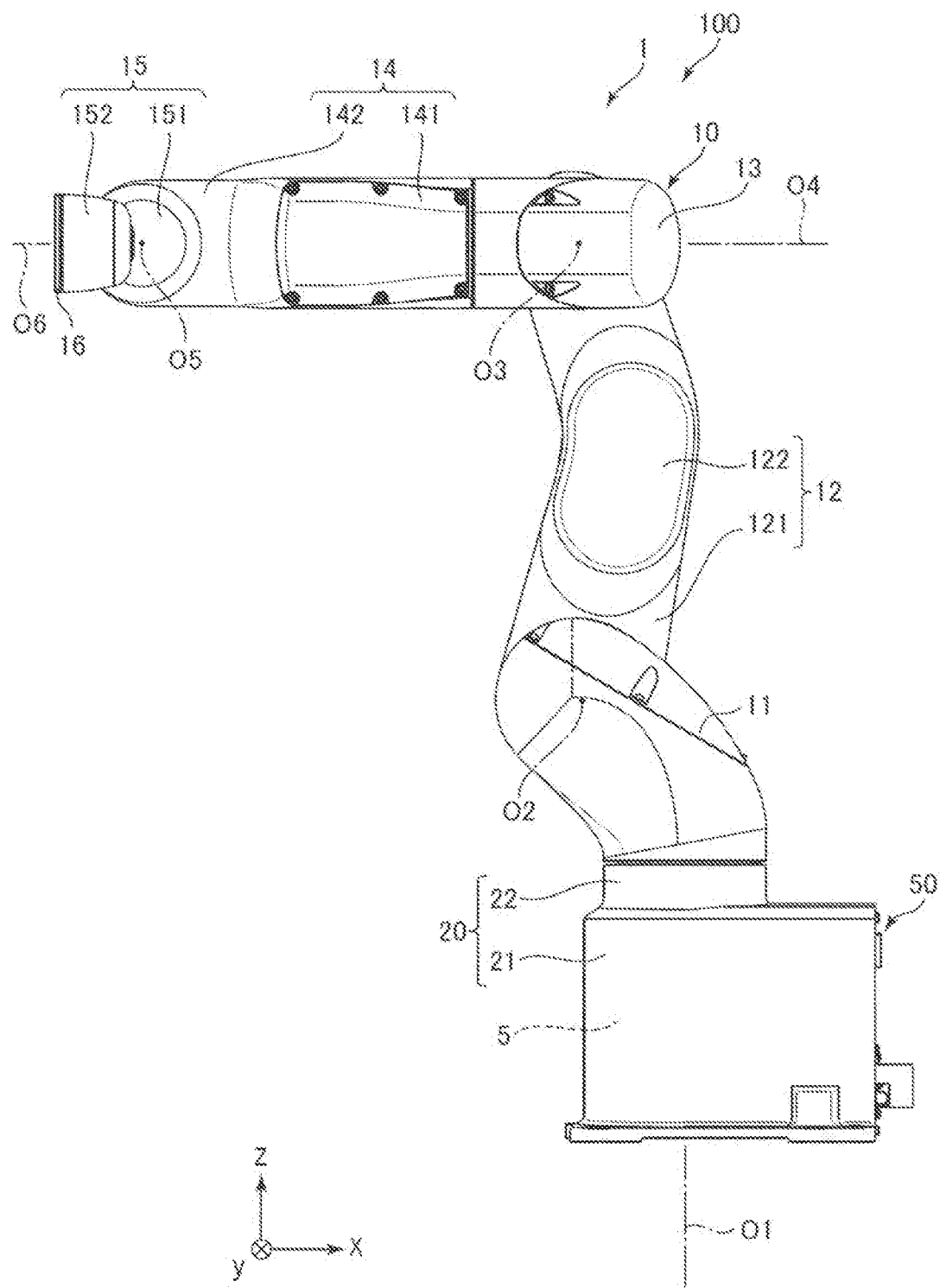
FIG. 4 is a diagram of the robot shown in FIG. 1 viewed from a -y-axis side.
Figure 5:
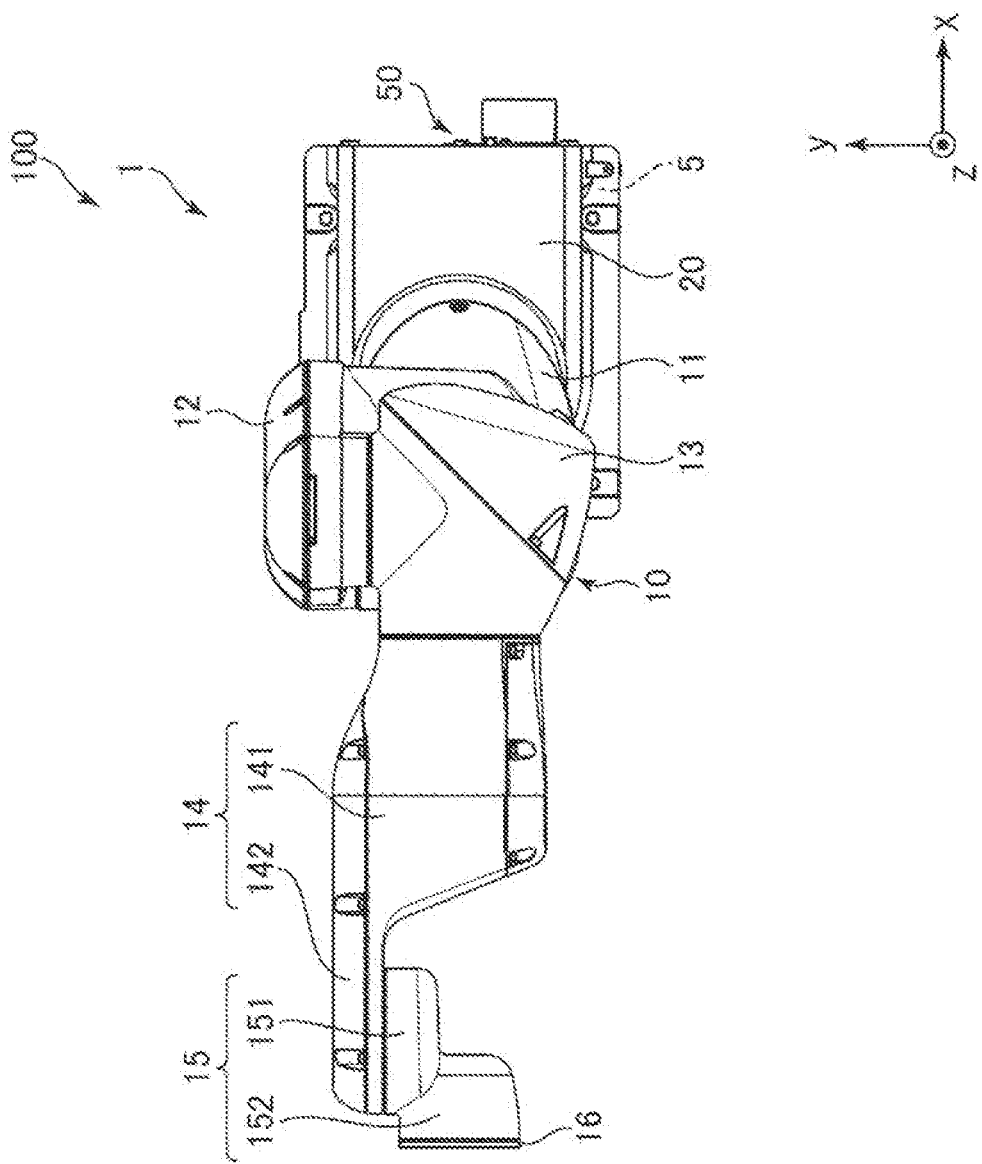
FIG. 5 is a diagram of the robot shown in FIG. 1 viewed from a +x-axis side.
Figure 6:
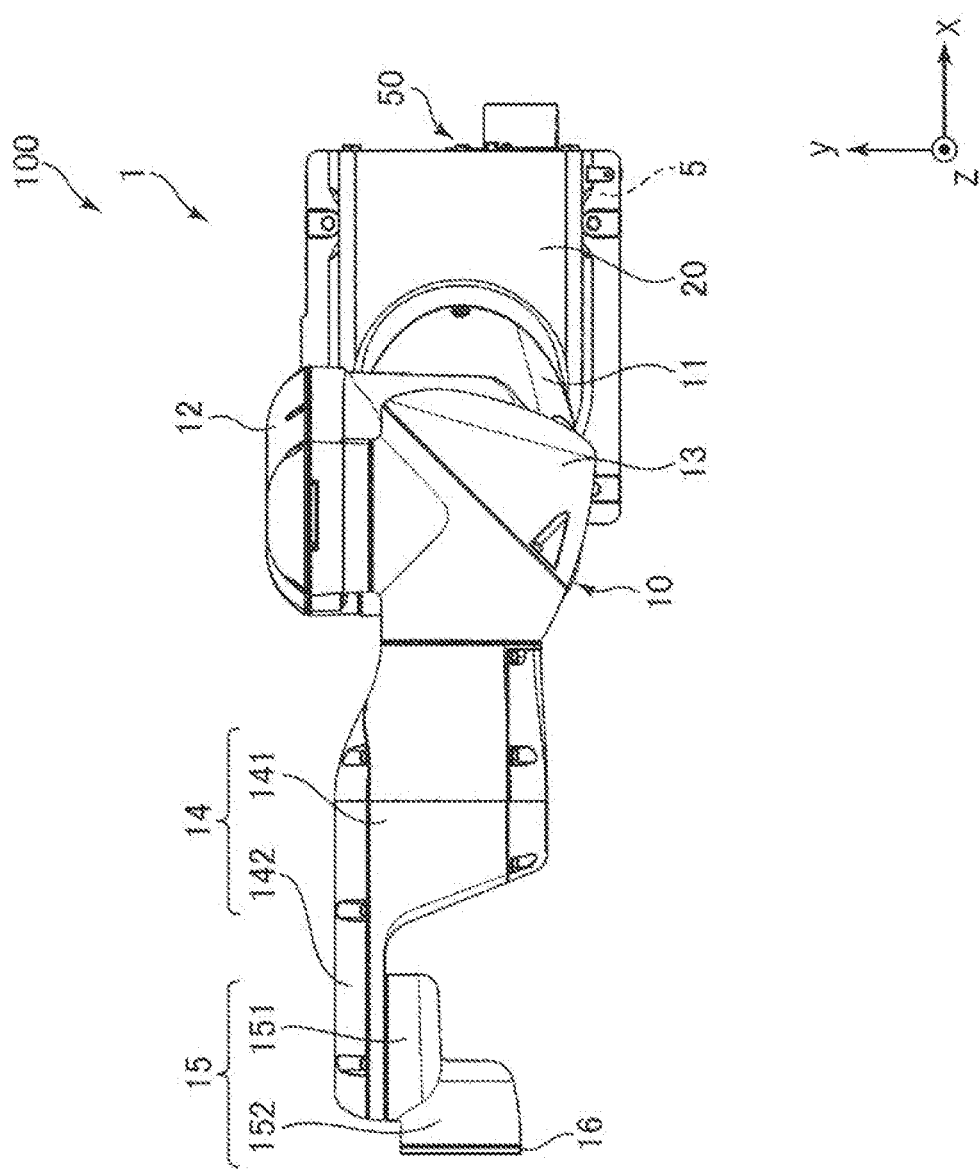
FIG. 6 is a diagram of the robot shown in FIG. 1 viewed from a +z-axis side.

FIG. 4 is a diagram of the robot 100 shown in FIG. 1 viewed for the −y-axis side. FIG. 5 is a diagram of the robot 100 shown in FIG. 1 viewed from the +x-axis side. FIG. 6 is a diagram of the robot 100 shown in FIG. 1 viewed from the +z-axis side. The upper side in FIG. 4 is referred to as "upper" and the lower side in FIG. 4 is referred to as "lower". The up-down direction in FIG. 4 is referred to as "vertical direction" and the left-right direction in FIG. 4 is referred to as "horizontal direction".

As shown in FIG. 4, the arm 11 is coupled to the protruding section 22 of the base 20 and is turnable with respect to the base 20 around a turning axis O1 extending along the vertical direction. The arm 11 is formed in a shape extending while inclining toward the upper side from the base 20. The distal end portion of the arm 11 projects further to the outer side than the base 20 when viewed from the z-axis direction.

As shown in FIGS. 4 and 5, the arm 12 is coupled to a portion on the +y-axis side of the distal end portion of the arm 11 and is turnable with respect to the arm 11 around a turning axis O2 extending along the horizontal direction. The arm 12 is formed in a long shape bent in the center when viewed from the y-axis direction and includes a flat section 121 formed in a shape extending from the arm 11 toward the arm 13 and a protruding section 122 projecting toward the −y-axis direction from the center of the flat section 121. The protruding section 122 is separated from the arm 11 not to come into contact with the arm 11 even if the arm 12 turns.

As shown in FIGS. 4, 5, and 6, the arm 13 is coupled to the same surface (the same portion) on the −y-axis side as a surface of the flat section 121 on which the arm 11 is provided. The arm 13 is turnable with respect to the arm 12 around a turning axis O3 extending along the horizontal direction. The arm 13 is formed in a shape projecting toward the −y-axis direction from the arm 12. The arm 13 is coupled to the arm 12 not to come into contact with the protruding section 122.

As shown in FIG. 4, the arm 14 is coupled to the distal end portion of the arm 13 and is turnable with respect to the arm 13 around a turning axis O4 orthogonal to the turning axis O3. As shown in FIG. 6, the arm 14 is formed in a shape extending from the arm 13 toward the −x-axis direction. The length (the width) in the y-axis direction of the arm 14 gradually decreases from the proximal end side to the distal end side halfway in the arm 14 and toward the +y-axis direction (one side in the width direction of the arm 14). The arm 14 includes a first portion 141 on the proximal end side and a second portion 142 on the distal end side shorter than the first portion 141 in the y-axis direction.

As shown in FIG. 4, the arm 15 is coupled to a portion on the −y-axis side of the second portion 142 on the distal end side and is turnable with respect to the arm 14 around a turning axis O5 orthogonal to the turning axis O4. As shown in FIGS. 4 and 6, the arm 15 includes a third portion 151 projecting from the distal end portion of the arm 14 toward the −y-axis direction and a fourth portion 152 coupled to the third portion 151. The external shape of the third portion 151 is formed in a columnar shape. On the other hand, the external shape of the fourth portion 152 is formed in a cylindrical shape. The fourth portion 152 includes a hole 153 piercing through the fourth portion 152 along the x-axis direction (see FIG. 2). As shown in FIG. 6, a portion further on the +y-axis side than the center line of the fourth portion 152 is coupled to the proximal end portion of the third portion 151. In this embodiment, the third portion 151 and the fourth portion 152 are integrally formed.

As shown in FIG. 4, the arm 16 is coupled to the distal end portion of the arm 15 and is turnable with respect to the arm 15 around a turning axis O6 orthogonal to the turning axis O5. The arm 16 is formed in a disk shape and includes, in the center, a hole 161 (a first hole) piercing through the arm 16 along the x-axis direction (see FIG. 1). The hole 161 communicates with the hole 153 (a second hole) included in the fourth portion 152 of the arm 15. The hole 161 and the hole 153 configure a through-hole 160 (see FIGS. 1 and 2). Although not shown in FIG. 4, the arm 16 is configured such that an end effector that performs various kinds of work such as gripping on a work object can be attached to the arm 16. In that case, a wire (not shown in FIG. 4) for transmitting a driving force to the end effector can be inserted through the through-hole 160. For example, although not shown in FIG. 4, the arm 16 may be configured such that a force detecting device (a force senor) that detects a force (including a moment) applied to the end effector can be attached to the arm 16. In that case, the force detecting device is desirably provided between the end effector and the arm 16.

As explained above, the robot 100 including the robot main body section 1 having such a configuration is the vertical articulated robot including six (a plurality of) arms 11 to 16. In other words, the robot 100 is a robot including six turning axes O1 to O6 and six degrees of freedom. Therefore, a driving range of the distal end portion of the robot arm 10 is wide. Accordingly, high workability can be exerted. In this embodiment, the number of arms included in the robot 100 is six. However, the number of arms may be one to five or seven or more. However, the number of arms (the number of turning axes) is desirably at least six or more in order to accurately locate, in a target part in a three-dimensional space, the end effector provided at the distal end of the robot arm 10.

As explained above, the arm 12 is coupled to a portion on the +y-axis side of the distal end portion of the arm 11. In this way, the arm 12 is cantilever-supported by the arm 11 rather than being double-supported to be held by the arm 11. The robot arm 10 includes the arm 11 and the arm 12 cantilever-supported by the arm 11.

Consequently, the configuration of the arms 11 and 12 can be simplified and cost can be reduced compared with when the arm 12 is double-supported by the arm 11.

Further, as explained above, the arm 15 is coupled to the portion on the −y-axis side of the second portion 142. In this way, the arm 15 is cantilever-supported by the arm 14 rather than being double-supported to be held by the arm 14. The robot arm 10 includes the arm 14 and the arm 15 cantilever-supported by the arm 14.

Consequently, the configuration of the arms 14 and 15 can be simplified and cost can be reduced compared with when the arm 15 is double-supported by the arm 14.

In this embodiment, the volume in the base 20 is the same as or smaller than the volume of the robot arm 10. Therefore, a degree of freedom of setting of the base 20 can be increased.

Driving Section

The robot 100 includes, as shown in FIG. 3, (six, in this embodiment) driving sections 30 as many as the arms 11 to 16. The plurality of driving sections 30 have a function of respectively turning arms corresponding to the driving sections 30 with respect to the arms (or the base 20) located on the proximal end side of the arms. The driving sections 30 include motor units 301 including motors functioning as power sources and brakes, speed reducers 302, and power transmission mechanisms (not shown in FIG. 3) including belts (not shown in FIG. 3) and pulleys (not shown in FIG. 3).

In this embodiment, one driving section 30 performs driving of one arm. Therefore, the robot 100 includes a first driving section 31 that drives the arm 11, a second driving section 32 that drives the arm 12, a third driving section 33 that drives the arm 13, a fourth driving section 34 that drives the arm 14, a fifth driving section 35 that drives the arm 15, and a sixth driving section 36 that drives the arm 16. In the following explanation, when the first driving section 31, the second driving section 32, the third driving section 33, the fourth driving second 34, the fifth driving section 35, and the sixth driving section 36 are not distinguished, the driving sections are respectively referred to as driving sections 30.

FIG. 7 is a perspective view schematically showing the inside of the robot main body section 1 included in the robot 100 shown in FIG. 1.

As shown in FIG. 7, the motor unit 301 and the speed reducer 302 included in the first driving section 31 are each provided in the arm 11. Although not shown in detail, the first driving section 31 includes a first pulley (not shown in FIG. 7) coupled to a shaft section of the motor unit 301, a second pulley (not shown in FIG. 7) disposed separately from the first pulley and coupled to a shaft section of the speed reducer 302, and a belt (not shown in FIG. 7) laid over the first pulley and the second pulley. The second pulley is coupled to a bearing (not shown in FIG. 7) included in the arm 11. Consequently, the arm 11 is turnable by being driven by the first driving section 31. The second driving section 32, the third driving section 33, the fourth driving section 34, the fifth driving section 35, and the sixth driving section 36 explained below are substantially the same and drive the arms corresponding to the driving sections with so-called belt driving.

As shown in FIG. 7, the motor unit 301 included in the second driving section 32 is provided in the protruding section 122. The speed reducer 302 included in the second driving section 32 is provided in a coupling portion (a joint section) of the arm 12 and the arm 11. The motor unit 301 included in the third driving section 33 is provided in the protruding section 122. The speed reducer 302 included in the third driving section 33 is provided in a coupling portion (a joint section) of the arm 12 and the arm 13. The motor unit 301 and the speed reducer 302 included in the fourth driving section 34 are each provided in the arm 13. The motor unit 301 included in the fifth driving section 35 is provided in the first portion 141 on the proximal end side of the arm 14. The speed reducer 302 included in the fifth driving section 35 is provided in the third portion 151 of the arm 15. The motor unit 301 included in the sixth driving section 36 is provided in the first portion 141 on the proximal end side of the arm 14. The speed reducer 302 included in the sixth driving section 36 is provided in the fourth portion 152 of the arm 15 (see FIG. 7). Although not shown in FIG. 7, the sixth driving section 36 includes a converting mechanism that converts a transmission direction of a driving force of a bevel gear or the like by 90°.

Position Sensor

As shown in FIG. 3, the robot 100 includes the position sensors 40 as many as the driving sections 30. One position sensor (angle sensor) 40 is provided with respect to one driving section 30. The position sensors 40 detect rotation angles of rotating shafts (shaft sections) of the motor units 301 (specifically, the motors) or the speed reducers 302. Consequently, it is possible to obtain information such as angles (postures) of the arms on the distal end side with respect to the arms on the proximal end side. As such position sensors 40, for example, a rotary encoder can be used. The position sensors 40 are electrically coupled to the control board 51 included in the control unit 5 explained below.

Control Unit

The control unit 5 includes, as shown in FIG. 3, the control board 51, the power supply board 52 that supplies electric power to the control board 51, and a plurality of driving boards 53 that drive the driving sections 30 based on a command of the control board 51. The control board 51 and the power supply board 52 configure a control device (a controller) that supplies electric power for the driving of the robot 100 and controls the driving of the robot 100.

Control Board

As shown in FIG. 7, the control board 51 is provided in the internal space S20. The control board 51 includes a control circuit (not shown in FIG. 7) that controls the driving of the robot 100. The control circuit includes a processor such as a CPU (Central Processing Unit), a volatile memory such as a RAM (Random Access Memory), and a nonvolatile memory such as a ROM (Read Only Memory) and performs processing such as control of driving of the sections of the robot 100, various arithmetic operations, and determination. For example, the control circuit is capable of executing a predetermined control program. The control circuit outputs control signals to the driving boards 53 according to the control program to cause the robot 100 (specifically, the robot arm 10) to execute a predetermined operation.

Power Supply Board

As shown in FIG. 7, the power supply board 52 is provided in the internal space S20. The power supply board 52 includes a power supply circuit (not shown in FIG. 7) that generates electric power supplied to each of the control board 51 and the driving boards 53. The power supply circuit includes a transformer and a noise filter. The power supply circuit converts a frequency and a voltage of electric power supplied from an external power supply (not shown in FIG. 7) such as a commercial power supply and supplies the electric power to the control board 51 and the driving boards 53. In particular, in this embodiment, the power supply circuit includes a converter that converts an AC voltage output from the external power supply into a 52V DC voltage (driving voltage) and outputs the DC voltage to the driving boards 53 and the like.

Driving Board

As shown in FIG. 7, the driving boards 53 are distributedly disposed in the internal space S10. The driving boards 53 include driving circuits (not shown in FIG. 7) that receive a control signal from the control board 51 and convert the electric power supplied from the external power supply into electric power (generate electric power) to be supplied to the driving sections 30. The driving circuits include, for example, inverter circuits that convert DC power (current) into AC power (current).

In this embodiment, one driving board 53 is provided with respect to one driving section 30. The driving boards 53 corresponding to the driving sections 30 perform conversion (generation) of electric power to be supplied to the driving sections 30. Therefore, the robot 100 includes a first driving board 531 corresponding to the first driving section 31, a second driving board 532 corresponding to the second driving section 32, a third driving board 533 corresponding to the third driving section 33, a fourth driving board 534 corresponding to the fourth driving section 34, a fifth driving board 535 corresponding to the fifth driving section 35, and a sixth driving board 536 corresponding to the sixth driving section 36. In the following explanation, when the first driving board 531, the second driving board 532, the third driving board 533, the fourth driving board 534, the fifth driving board 535, and the sixth driving board 536 are not distinguished, the driving boards are respectively referred to as driving boards 53.

As shown in FIG. 7, the first driving board 531 is provided in the arm 11 and is provided in the vicinity of the motor unit 301 included in the first driving section 31. The second driving board 532 is provided in the protruding section 122 of the arm 12 and is provided in the vicinity of the motor unit 301 included in the second driving section 32. The third driving board 533 is provided in the protruding section 122 of the arm 12 and is provided in the vicinity of the motor unit 301 included in the third driving section 33. The fourth driving board 534 is provided in the arm 13 and is provided in the vicinity of the motor unit 301 included in the fourth driving section 34. The fifth driving board 535 is provided in the first portion 141 of the arm 14 and is provided in the vicinity of the motor unit 301 included in the fifth driving section 35. The sixth driving board 536 is provided in the first portion 141 of the arm 14 and is provided in the vicinity of the motor unit 301 included in the sixth driving section 36.

External Coupling Section

As shown in FIGS. 2 and 4, the plurality of external coupling sections 50 configured by, for example, connectors are provided in the base 20. The external coupling sections 50 are attached to the base 20 to expose a part of the external coupling sections 50 to the outside and electrically coupled to the control board 51 and the power supply board 52. The external coupling sections 50 are components for coupling a plug 66 (a section to be coupled) included in an external cable 60 coupled to, for example, an external power supply (not shown in FIGS. 2 and 4). The external coupling sections 50 are components for performing electric coupling between the external power supply, various devices, and the like and the robot 100.

Specific examples of the external coupling sections 50 include a power supply connector for coupling an external power supply plug electrically coupled to the external power supply, a connector for input and output of signals to and from various devices such as teaching pendant used by an operator to give an operation instruction to the robot 100, a connector for output of a signal to the end effector, and a connector for input and output of data concerning a control program and the like.

By coupling the plug 66 to the external coupling section 50, electric power is supplied to the robot 100. The robot 100 can be driven.

Exterior Member

Figure 8:
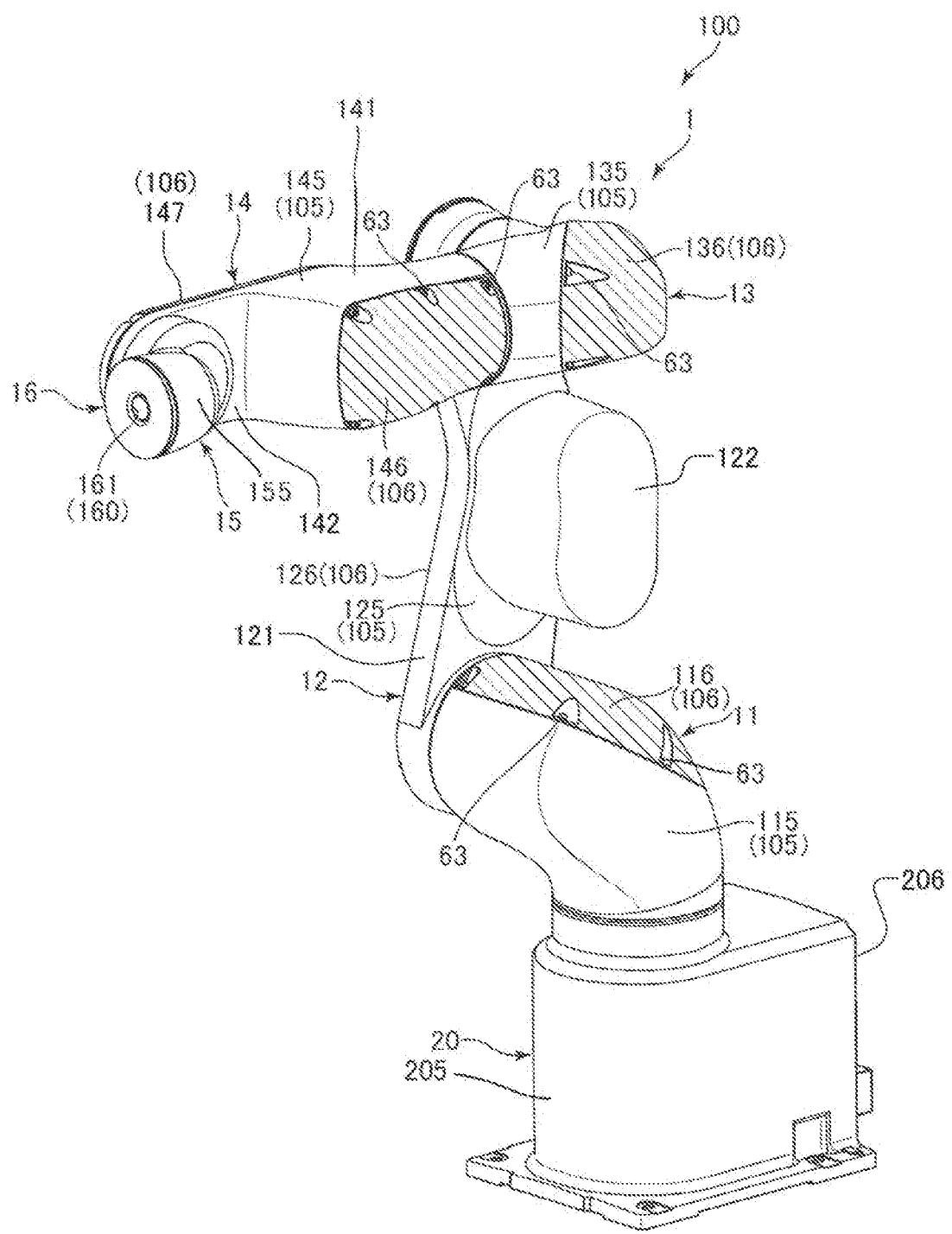
FIG. 8 is a diagram for explaining a plurality of housings and a plurality of covers included in the robot.

FIG. 8 is a diagram for explaining the plurality of housings 105 and the plurality of covers 106 included in the robot 100.

The robot main body section 1 includes, as shown in FIG. 8, a plurality of exterior members (the housings 105, the covers 106, etc.). Specifically, the base 20 and the arms 11 to 14 each include the housing 105 and the cover 106. The arm 15 includes a case 155. More specifically, the base 20 includes a housing 205 (a fifth housing) and a cover 206 (a sixth cover). The arm 11 includes a housing 115 (a first housing) and a cover 116 (a first cover). The second arm 12 includes a housing 125 (a second housing) and a cover 126 (a second cover). The third arm 13 includes a housing 135 (a third housing) and a cover 136 (a third cover). The arm 14 includes a housing 145 (a fourth housing), a cover 146 (a fourth cover), and a cover 147 (a fifth cover). The arm 15 includes the case 155. In the following explanation, when the housing 205, the housing 115, the housing 125, the housing 135, and the housing 145 are not distinguished, the housings are respectively referred to as housings 105. When the cover 206, the cover 116, the cover 126, the cover 136, the cover 146, and the cover 147 are not distinguished, the covers are respectively referred to as covers 106.

The external shape of the housing 205 of the base 20 is formed in a substantially rectangular parallelepiped shape. On the other hand, the external shape of the cover 206 is formed in a square flat shape. The +x-axis side and the +z-axis side of the housing 205 are respectively opened. The +x-axis side opening of the housing 205 is closed by the cover 206. For example, the cover 206 is screwed to the housing 205.

The housing 115 of the arm 11 is opened at the proximal end portion (the −z-axis side) of the housing 115 and on the +z-axis side and the +y-axis side of the distal end portion of the housing 115. The housing 115 is disposed in a state in which an edge portion forming the opening at the proximal end portion (the −z-axis side opening) is abutted against an edge portion forming the +z-axis side opening of the housing 205. The +x-axis side opening of the distal end portion of the housing 115 is closed by the cover 116. For example, the cover 116 is screwed to the housing 115.

The housing 125 of the arm 12 is located on the −y-axis side with respect to the cover 126 and mainly forms a portion on the −y-axis side of the flat section 121 and the protruding section 122. On the other hand, the cover 126 is located on the +y-axis side with respect to the housing 125 and mainly forms a portion on the +y-axis side of the flat section 121. The housing 125 is opened on the −y-axis side of the proximal end portion of the housing 125, the −y-axis side of the distal end portion of the housing 125, and the entire +y-axis side region. The housing 125 is disposed in a state in which an edge portion forming the −y-axis side opening of the proximal end portion of the housing 125 is abutted against an edge portion forming the +y-axis side opening of the distal end portion of the housing 115. The +y-axis side opening of the housing 125 is closed by the cover 126. In this embodiment, the cover 126 is screwed to the housing 125 by screws 63.

The housing 135 of the arm 13 is opened at the proximal end portion (the +y-axis side) of the housing 135 and the distal end portion (the −x-side) of the housing 135 and on the +x-axis side of the intermediate portion of the housing 135. The housing 135 is disposed in a state in which an edge portion forming the opening of the proximal end portion (the +y-axis side opening) is abutted against an edge portion forming the −y-axis side opening of the distal end portion of the housing 125. The +x-axis side opening of the intermediate portion of the housing 135 is closed by the cover 136. In this embodiment, the cover 136 is screwed to the housing 135 by the screws 63.

The housing 145 of the arm 14 forms most of the first portion 141 on the proximal end side and most of the second portion 142 on the distal end side. On the other hand, the cover 146 forms the remaining portion of the first portion 141 on the proximal end side. The cover 147 forms the remaining portion of the second portion 142 on the distal end side. The housing 145 is opened at the proximal end portion (the +x-side) of the housing 145, on the −y-axis side in the first portion 141 on the proximal end side, and in substantially the entire region on the +y-axis side. The housing 145 is disposed in a state in which an edge portion forming the opening of the proximal end portion (the +x-axis side opening) is abutted against an edge portion forming the distal end side opening (the −x-axis side opening) of the housing 135. The −y-axis side opening in the first portion 141 on the proximal end side of the housing 145 is closed by the cover 146. In this embodiment, the cover 146 is screwed to the housing 145 by the screws 63 and fixedly coupled to the housing 145. Similarly, the cover 147 is screwed to the housing 145 by the screws 63.

The case 155 of the arm 15 forms the entire exterior region of the arm 15 and is opened at the proximal end portion (the +y-axis side) of the case 155 and the distal end portion (the −x-axis side) of the case 155. The case 155 is disposed in a state in which an edge portion forming the opening at the proximal end portion (the +y-axis side opening) of the case 155 is abutted against an edge portion forming the distal end side opening (the −y-axis side opening) of the housing 145. The arm 16 formed in the disk shape is turnably coupled to the edge portion forming the opening at the distal end portion (the −x-axis side opening) of the case 155.

In this way, the robot 100 includes the plurality of housings 105, the plurality of covers 106, and the case 155. The internal space S1 is formed by such a plurality of exterior members.

The robot arm 10 can also be considered to include a housing (a first housing) including the plurality of housings 105 (first members) and the plurality of covers 106 (second members). The base 20 can also be considered to include a housing (a second housing) including the housing 205 and the cover 206.

In this embodiment, the arms 11 to 14 each include the housing 105 (the first member) and the cover 106 (the second member). However, not only this, but, for example, all the arms 11 to 16 may each include the housing 105 (the first member) and the cover 106 (the second member) or at least one of the arms 11 to 16 may include the housing 105 (the first member) and the cover 106 (the second member). In this embodiment, the base 20 and the robot arm 10 includes the plurality of housings 105 (the first members) and the plurality of covers 106 (the second members). However, not only this, but, for example, the base 20 and the robot arm 10 may include one housing 105 (first member) and one cover 106 (second member). For example, the housings 115, 125, 135, and 145 configuring the arms 11 to 14 may be integral. In this specification, the first member and the second member each indicate a member forming the internal space S1 (i.e., a member configuring the exterior of the robot main body section 1).

The housing 205 and the cover 206 are coupled via a sealing member (a first sealing member; not shown in FIG. 8) such as a gasket. The housing 105 and the cover 106 are coupled via a sealing member (a second sealing member; not shown in FIG. 8) such as a gasket. Consequently, the internal space S1 is blocked from the outside of the robot main body section 1 by the housing 205, the cover 206, the housing 105, the cover 106, and the sealing members. The robot main body section 1 is in a state in which the internal space S1 is sealed.

The basic configuration of the robot 100 is explained above.

As explained above, the control unit 5 having the function of the controller is housed on the inside of the robot main body section 1, that is, the internal space S1. The robot 100 includes the control board 51 and the power supply board 52 that supplies electric power to the control board 51, the control board 51 and the power supply board 52 being provided in the internal space S1. Further, the robot 100 includes the (in this embodiment, the plurality of) driving boards 53 that drive the driving section 30 based on a command of the control board 51. The cooling mechanism 23 for the control board 51 and the power supply board 52 is explained in detail below.

Cooling Mechanism

Figure 9:
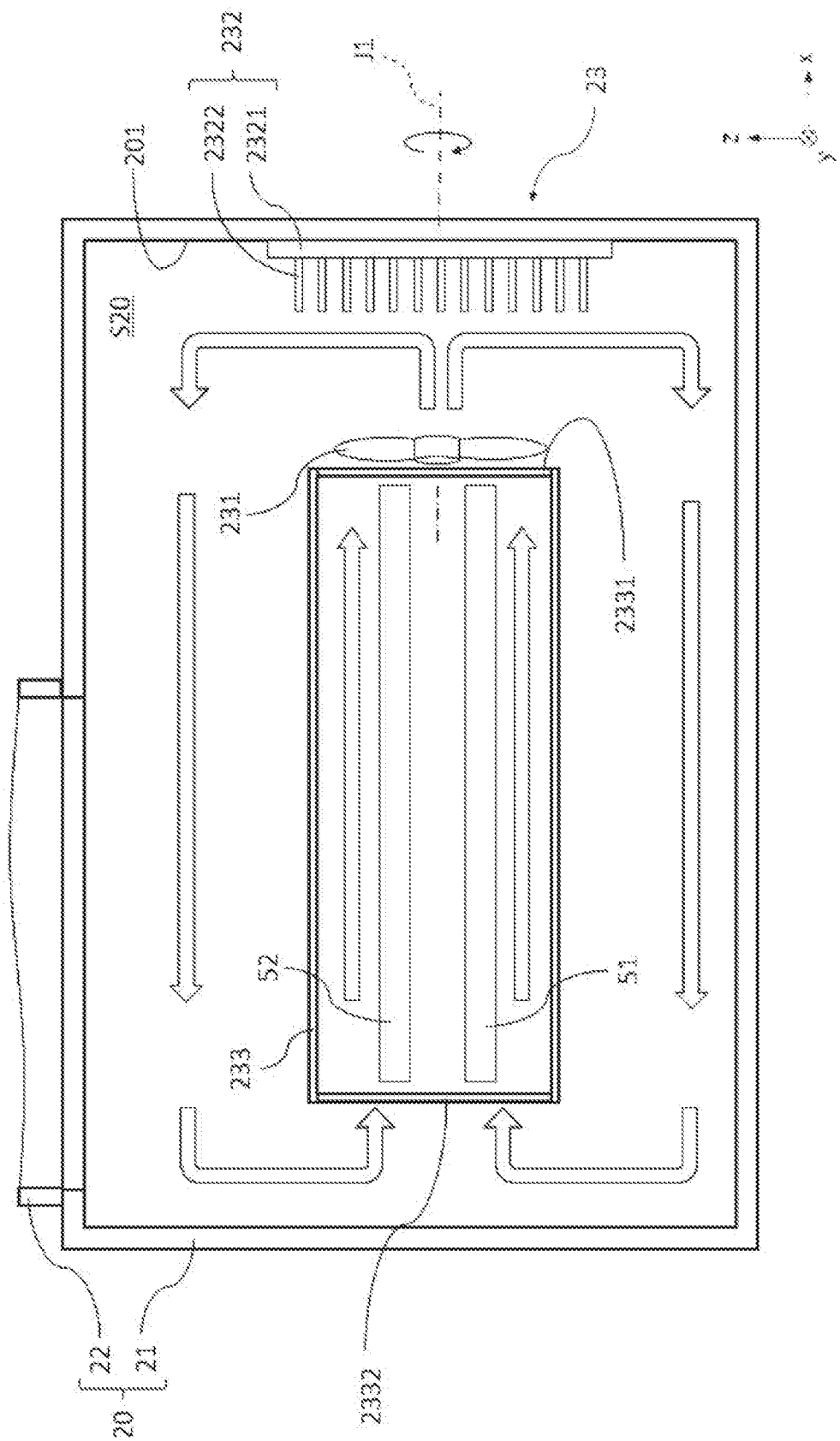
FIG. 9 is a sectional view of a base included in the robot shown in FIG. 1.

FIG. 9 is a sectional view schematically showing the inside of the base 20 included in the robot 100 shown in FIG. 1.

As shown in FIG. 9, the control board 51, the power supply board 52, a fan 231, a heat sink 232 provided on an inner wall 201 of the base 20, and a wind tunnel section 233 covering the control board 51 and the power supply board 52 are provided on the inside of the base 20. The fan 231, the heat sink 232, and the wind tunnel section 233 function as the cooing mechanism 23 that cools the control board 51 and the power supply board 52. The inner wall 201 of the base 20 means a surface on the internal space S20 side of the housing included in the base 20.

Fan

As shown in FIG. 9, the fan 231 (a first fan) is disposed such that a rotation axis J1 (a first rotation axis) is parallel to the x axis. The fan 231 rotates vanes around the rotation axis J1 to thereby generate wind in the +x-axis direction. The fan 231 stirs gas (air) filling the internal space S20 of the base 20, which is a part of the internal space S1 of the robot main body section 1, which is a sealed space. Consequently, it is possible to circulate the gas in the internal space S1 of the robot main body section 1.

For example, thick line arrows shown in FIG. 9 indicate a flow of the gas in the base 20. First, the gas moved in the +x-axis direction by the fan 231 is blown against the heat sink 232. Subsequently, the gas moves in a direction along a yz plane from the heat sink 232 and moves in the −x-axis direction along the inner wall 201 of the base 20. The moving direction of the gas is changed by the inner wall 201 on the −x-axis side. The gas moves into the wind tunnel section 233. Thereafter, the gas moves in the +x-axis direction on the inside of the wind tunnel section 233 and returns to the position of the fan 231.

A blowing-out direction (a direction in which the gas is moved) of the fan 231 is not limited to this and may be the −x-axis direction. In that case, a flow of the gas is in the opposite direction of the direction indicated by the thick line arrows shown in FIG. 9.

Heat Sink

The heat sink 232 (a fin) includes a tabular section 2321 having a flat shape and projecting sections 2322 projecting from the tabula section 2321 toward the fan 231. The tabular section 2321 is in contact with the inner wall 201 of the base 20 on one surface and includes a plurality of projecting sections 2322 on the other surface. Since the heat sink 232 includes the plurality of projecting sections 2322, it is possible to increase the surface area of the heat sink 232. It is possible to efficiently discharge heat in the internal space S20 of the base 20 to the outside of the base 20 via the housing of the base 20. The heat sink 232 may not be in direct contact with the inner wall 201 of the base 20 and may be in contact with the inner wall 201 via an adhesive material.

The material of the heat sink 232 is not particularly limited. However, the heat sink 232 is desirably formed of a material including a metal material having a high thermoelectric property such as aluminum, iron, or copper. It is possible to perform more efficient heat exhaust by using the metal material having the high thermoelectric property.

As shown in FIG. 9, the heat sink 232 is disposed in a position facing the fan 231. More specifically, the fan 231 and the heat sink 232 overlap in the axial direction of the rotation axis J1 of the fan 231. With this configuration, the gas can be efficiently blown against the heat sink 232 from the fan 231. Therefore, it is possible to improve heat radiation efficiency of the heat sink 232. One of the heat sink 232 and the fan 231 only has to partially overlap the other or may entirely overlap the other.

Figure 10:
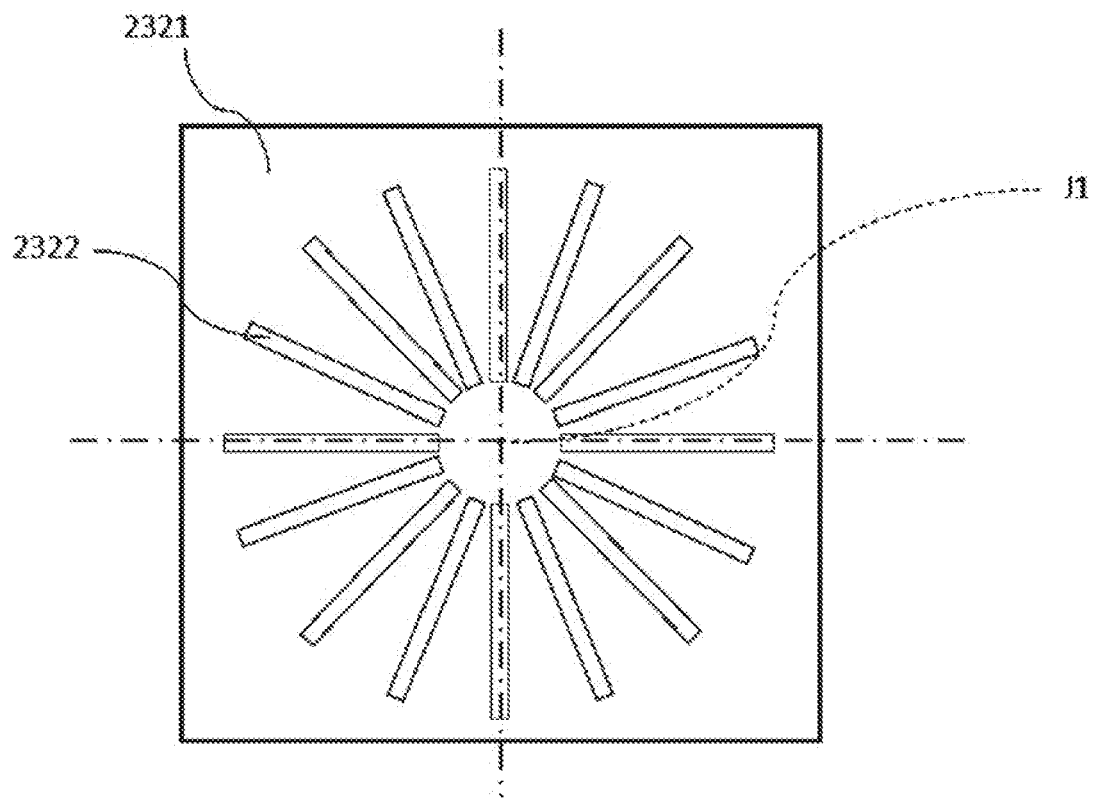
FIG. 10 is a plan view of a modification of a heat sink shown in FIG. 9.
Figure 11:
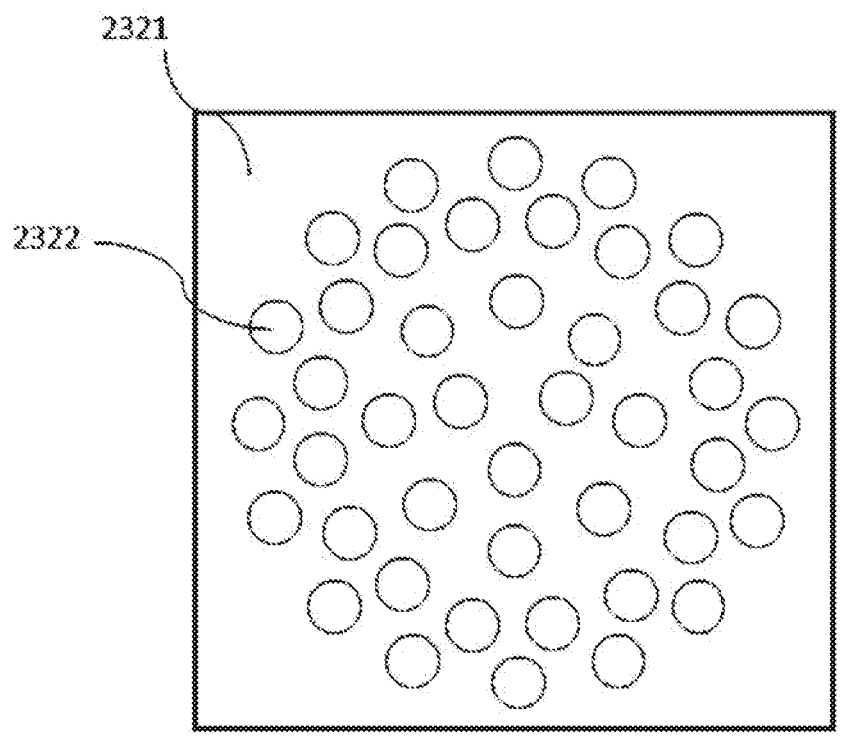
FIG. 11 is a plan view of a modification of the heat sink shown in FIG. 9.

Further, the heat sink 232 may have a configuration shown in FIGS. 10 and 11.

FIG. 10 is a plan view of a modification of the heat sink 232 shown in FIG. 9. FIG. 10 is a plan view of the modification of the heat sink 232 in a plan view from the projecting direction of the projecting sections 2322. In the heat sink 232 shown in FIG. 10, the projecting sections 2322 are formed in a substantially rectangular parallelepiped shape. The plurality of projecting sections 2322 are radially disposed centering on a predetermined position. For example, when viewed in the +x-axis direction, the heat sink 232 is disposed such that the predetermined position overlaps the rotation axis J1 of the fan 231.

With this configuration, when the gas is blown by the fan 231, since movement (a flow) of the gas is not blocked by the projecting sections 2322, it is possible to efficiently stir the gas in the internal space S20 of the base 20.

FIG. 11 is a plan view of a modification of the heat sink 232 shown in FIG. 9. FIG. 11 is a plan view of the modification of the heat sink 232 in a plan view from the projecting direction of the projecting sections 2322.

The projecting sections 2322 of the heat sink 232 shown in FIG. 11 have a shape different from the shape of the projecting sections 2322 of the heat sink 232 shown in FIG. 10. The projecting sections 2322 are formed in a substantially columnar shape. With this configuration, when the gas is blown by the fan 231, since movement (a flow) of the gas is not blocked by the projecting sections 2322, it is possible to efficiently stir the gas in the internal space S20 of the base 20.

Wind Tunnel Section

As shown in FIG. 9, the wind tunnel section 233 is a member having a substantially cylinder shape including, in the x-axis direction, a first opening 2331 (an opening) and a second opening 2332 (an opening) communicating with the first opening 2331. The shape of the wind tunnel section 233 is not limited to this and may be a substantially cylindrical shape.

The control board 51 and the power supply board 52 supported by a sheet metal (not shown in FIG. 9) are disposed in parallel to an xy plane on the inside of the wind tunnel section 233. At this time, when viewed in the +z-axis direction, the control board 51 and the power supply board 52 overlap the wind tunnel section 233. In other words, the control board 51 and the power supply board 52 are covered by the wind tunnel section 233. One of the control board 51 and the power supply board 52 only has to be covered by the wind tunnel section 233. Both of the control board 51 and the power supply board 52 may be covered by the wind tunnel section 233. The control board 51 and the power supply board 52 only has to be partially covered or may be entirely covered.

In the x-axis direction, the fan 231 is disposed between the first opening 2331 and the heat sink 232. When viewed from the axial direction of the rotation axis J1 of the fan 231, the first opening 2331 overlaps the fan 231. Accordingly, when viewed from the axial direction of the rotation axis J1 of the fan 231, the fan 231, the heat sink 232, and the first opening 2331 overlap one another. One of the first opening 2331 and the fan 231 only has to partially overlap the other or may entirely overlap the other.

With such a configuration, an air duct can be formed to cover the control board 51 and the power supply board 52 that generate heat. Therefore, it is possible to efficiently lead the gas in the internal space S20 of the base 20 stirred by the fan 231 to the control board 51 and the power supply board 52.

The configuration of the cooling mechanism 23 is explained above. With the configuration explained above, the heat generated from the control board 51 and the power supply board 52 can be discharged to the outside of the base 20 by the stirring of the gas in the internal space S20 of the base 20 by the fan 231.

The gas heated by the heat of the control board 51 and the power supply board 52 passes through the first opening 2331 and is blown against the heat sink 232 provided on the inner wall 201 of the base 20 by the fan 231. The heat sink 232 having small heat resistance absorbs the heat of the blown gas and radiates the heat to the outside of the base 20. The gas passing near the heat sink 232 to be cooled further moves along the inner wall 201 of the base 20 and absorbs heat from the control board 51 and the power supply board 52 again.

By stirring the gas in the internal space S20 of the base 20 in this way, it is possible to circulate the gas and reduce a state in which temperature locally rises in the internal space S20.

Therefore, the opening is provided in the housing of the base 20. Even in the robot 100 having a sealed structure in which the gas heated by the control board 51 and the power supply board 52 cannot be discharged to the outside of the base 20, the gas is stirred by the fan 231 on the inside of the base 20. Heat is radiated in the entire housing of the base 20 using the heat sink 232 provided on the inner wall 201 of the base 20. Consequently, it is possible to reduce a local rise of the temperature of the control board 51 and the power supply board 52 on the inside of the base 20 and efficiently perform heat exhaust.

Second Embodiment

In the second embodiment, the configuration of the cooling mechanism 23 is different from the configuration in the first embodiment. The other points of the second embodiment are the same as the points in the first embodiment.

Figure 12:
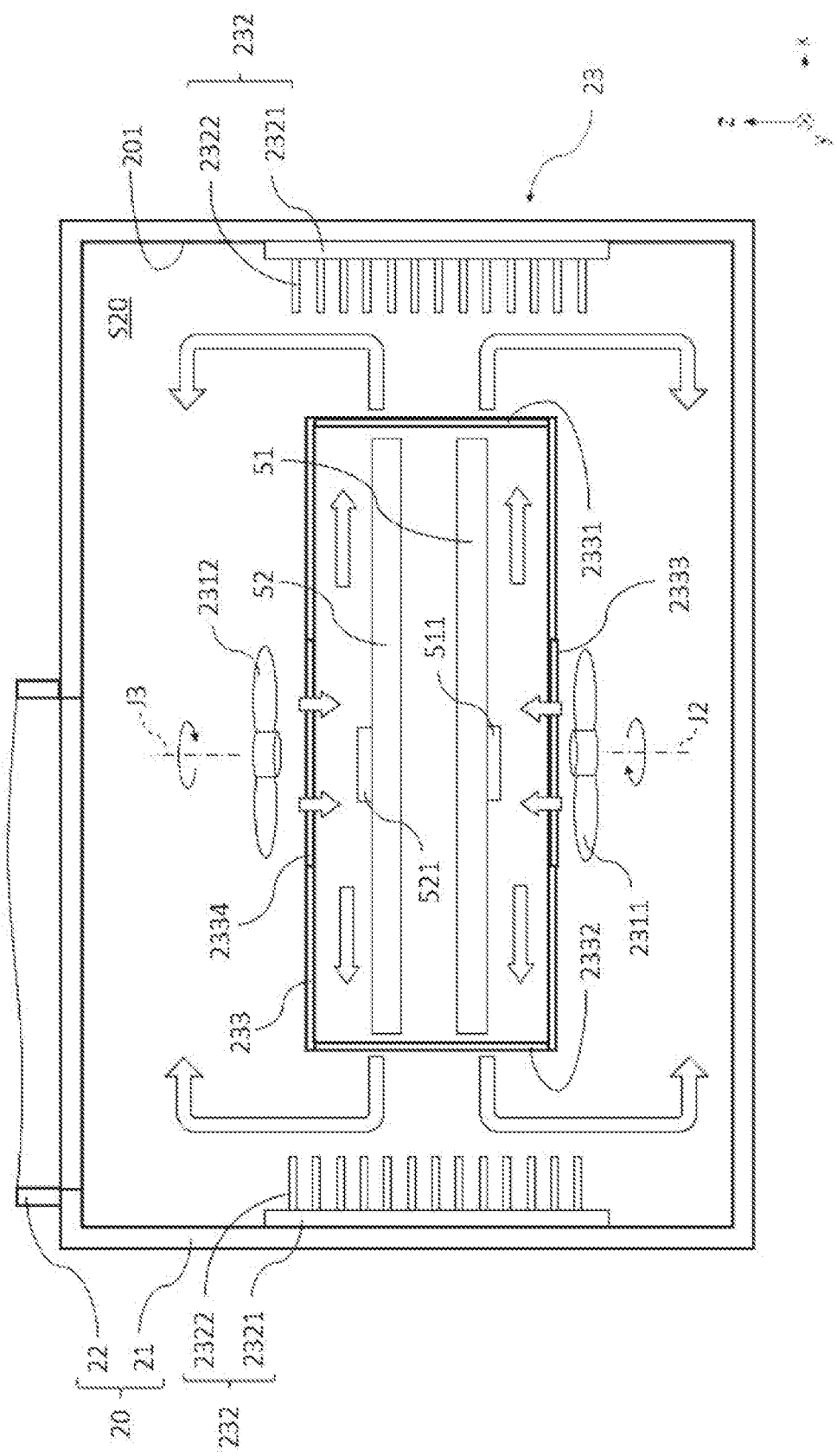
FIG. 12 is a sectional view of a base of a robot according to a second embodiment.

FIG. 12 is a sectional view schematically showing the inside of the base 20 of the robot 100 according to the second embodiment.

As shown in FIG. 12, the cooling mechanism 23 includes a fan 2311 (a second fan), a fan 2312 (a third fan), a plurality of heat sinks 232, and the wind tunnel section 233. On the control board 51 and the power supply board 52, heat generating sections 511 and 521 having particularly a high heat generation property among components provided on the respective boards are provided. For example, a heat generating section 511 (a first heat generating section) provided on the control board 51 is a CPU. A heat generating section 521 (a second heat generating section) provided on the power supply board 52 is a power device (a switching device) or a transistor.

In the wind tunnel section 233, a third opening 2333 and a fourth opening 2334 communicating with the third opening 2333 are provided in addition to the first opening 2331 and the second opening 2332. The third opening 2333 and the fourth opening 2334 are openings piercing through the wind tunnel section 233 in the z-axis direction. When viewed in the z-axis direction, the third opening 2333 overlaps the heat generating section 511 provided on the control board 51 and the fourth opening 2334 overlaps the heat generating section 521 provided on the power supply board 52. In the second embodiment, both of the third opening 2333 and the heat generating section 511 and the fourth opening 2334 and the heat generating section 521 overlap. However, not only this, but only one of the third opening 2333 and the heat generating section 511 and the fourth opening 2334 and the heat generating section 521 may overlap. The third opening 2333 and the heat generating section 511 only have to partially overlap or may entirely overlap. Similarly, the fourth opening 2334 and the heat generating section 521 only have to partially overlap or may entirely overlap.

The fan 2311 is disposed such that a rotation axis J2 (a second rotation axis) is parallel to the z axis. The fan 2311 rotates vanes around the rotation axis J2 to generate wind in the +z-axis direction. Further, the fan 2311 is disposed to overlap the third opening 2333 and the heat generating section 511 of the control board 51 in a plan view in the z-axis direction. With this configuration, since the gas can be blown against the heat generating section 511 by the fan 2311, the gas, wind speed of which is increased by the fan 2311, can be hit against the heat generating section 511. It is possible to efficiently cool the heat generating section 511.

Similarly, the fan 2312 is disposed such that a rotation axis J3 (a third rotation axis) is parallel to the z axis. Wind is generated in the −z-axis direction by rotating vanes around the rotation axis J3. Further, the fan 2312 is disposed to overlap the fourth opening 2334 and the heat generating section 521 of the power supply board 52 in a plan view in the axial direction of the z axis. With this configuration, since the gas can be blown against the heat generating section 521 by the fan 2312, the gas, wind speed of which is increased by the fan 2312, can be hit against the heat generating section 521. It is possible to efficiently cool the heat generating section 521.

In the second embodiment, two heat sinks 232 in total are provided on the inside of the base 20: one in a position facing the first opening 2331 and one in a position facing the second opening 2332. The heat sink 232 provided on the first opening 2331 side has the same configuration as the configuration in the first embodiment. Therefore, explanation of the configuration is omitted.

The heat sink 232 provided on the second opening 2332 side is disposed such that the projecting sections 2322 project in the +x-axis direction. When viewed in the z-axis direction, the heat sink 232 provided on the second opening 2332 side and the second opening 2332 overlap. One of the heat sink 232 and the second opening 2332 only has to partially overlap the other or may entirely overlap the other.

The configuration of the cooling mechanism 23 in the second embodiment is explained above. With the configuration explained above, the positions of the heat generating sections 511 and 521 that generate heat on the control board 51 and the power supply board 52 are known. Therefore, it is possible to more efficiently exhaust heat to the outside of the base 20 with the gas stirred by the fans 2311 and 2312.

The gas on the outside of the wind tunnel section 233 passes through the third opening 2333 and the fourth opening 2334 and is blown against the heat generating sections 511 and 521 by the fans 2311 and 2312. The temperature of the gas rises with heat of the heat generating sections 511 and 521. Subsequently, the gas moves in the wind tunnel section 233 in the directions of the first opening 2331 and the second opening 2332, passes through the first opening 2331 and the second opening 2332, and flows out to the outside of the wind tunnel section 233. The gas hits the heat sinks 232. The heat sinks 232 absorb heat from the gas. The temperature of the gas falls. Thereafter, the gas moves along the inner wall 201 of the base 20 and is blown against the heat generating sections 511 and 521 by the fans 2311 and 2312 again. (For example, thick line arrows shown in FIG. 12 indicate moving directions of the gas.)

It is possible to concentratedly cool the heat generating sections 511 and 521 by blowing the gas against the heat generating sections 511 and 521 with the fans 2311 and 2312 in this way. Therefore, it is possible to further reduce a local rise of temperature in the internal space S20 of the base 20. Accordingly, even in the robot 100 having the sealed structure, it is possible to efficiently radiate heat in the entire housing of the base 20. It is possible to efficiently perform heat exhaust.

In the second embodiment, the wind is sent toward the heat generating sections 511 and 521. However, the wind may be sent in the opposite direction. In that case, the heat generating sections 511 and 521 sides have a negative pressure. The same effects can be achieved.

In the second embodiment, the number of fans is two. However, not only this, but the number of fans may be one or may be three or more.

In the second embodiment, the number of heat sinks is two. However, not only this, but the number of heat sinks may be one or may be three or more.

Third Embodiment

In a third embodiment, the configuration of the wind tunnel section 233 is different from the configuration in the first embodiment. The other points in the third embodiment are the same as the points in the first embodiment.

Figure 13:
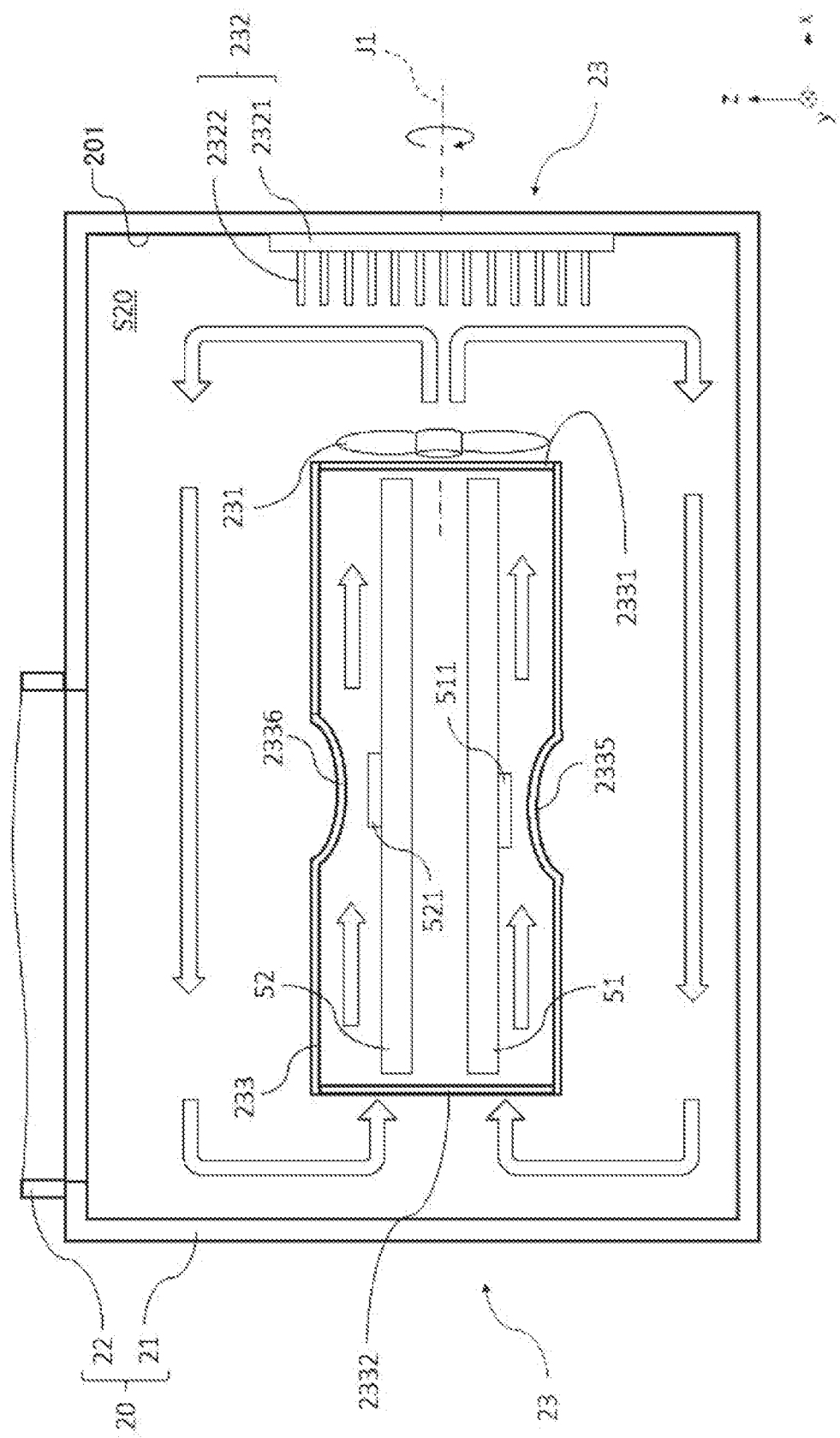
FIG. 13 is a sectional view of a base of a robot according to a third embodiment.

FIG. 13 is a sectional view schematically showing the inside of the base 20 of the robot 100 according to the third embodiment.

The wind tunnel section 233 includes, as shown in FIG. 13, a recessed section 2335 (a first recessed section) and a recessed section 2336 (a second recessed section) between the first opening 2331 and the second opening 2332 in the x-axis direction. The recessed section 2335 and the recessed section 2336 are recessed to the inner side of the wind tunnel section 233 in which the control board 51 and the power supply board 52 are disposed. In other words, the length of the wind tunnel section 233 in the z-axis direction is smaller in portions where the recessed section 2335 and the recessed section 2336 are provided than portions having the first opening 2331 and the second opening 2332.

The recessed section 2335 is provided to overlap the heat generating section 511 of the control board 51 in a plan view in the z-axis direction. The recessed section 2336 is provided to overlap the heat generating section 521 of the power supply board 52 in a plan view in the z-axis direction. The recessed section 2335 only has to at least partially overlap the heat generating section 511 or may be entirely overlap the heat generating section 511. Similarly, the recessed section 2336 only has to at least partially overlap the heat generating section 521 or may entirely overlap the heat generating section 521.

The length from a wall section on the +z-axis side of the wind tunnel section 233 overlapping the heat generating section 511 to a wall section on the −z-axis side of the wind tunnel section 233 overlapping the heat generating section 521 in the z-axis direction is smaller than the length from a wall section on the +z-axis side of the wind tunnel section 233 not overlapping the heat generating section 511 to a wall section on the −z-axis side of the wind tunnel section 233 not overlapping the heat generating section 521.

With this configuration, the wind tunnel section 233 is narrowed in portions overlapping the heat generating sections 511 and 521 in the plan view in the z-axis direction. Therefore, when passing in the wind tunnel section 233, the gas passes narrow regions in the portions where the heat generating sections 511 and 521 are disposed. It is possible to increase moving speed of the gas that hits the heat generating sections 511 and 521.

A flow of the gas (thick line arrows shown in FIG. 13) on the inside of the base 20 is explained.

The gas heated by heat of the control board 51 and the power supply board 52 passes through the first opening 2331 and is blown against the heat sink 232 provided on the inner wall 201 of the base 20 by the fan 231. The heat sink 232 having small heat resistance absorbs heat of the blown gas and radiates the heat to the outside of the base 20. The gas passing near the heat sink 232 and cooled further moves along the inner wall 201 of the base 20 and flows into the wind tunnel section 233 from the second opening 2332. The gas absorbs heat from the control board 51 and the power supply board 52 again.

It is possible to concentratedly cool the heat generating sections 511 and 521 by hitting the gas, wind speed of which is increased by the recessed sections 2335 and 2336, against the heat generating sections 511 and 521. Therefore, it is possible to further reduce a local rise of temperature in the internal space S20 of the base 20. Accordingly, even in the robot 100 having the sealed structure, it is possible to efficiently perform heat exhaust by radiating heat in the entire housing of the base 20.

The robot 100 according to the present disclosure is explained based on the embodiments shown in the figures. However, the present disclosure is not limited to this. The components of the sections can be replaced with any components having the same functions. Any other components may be added to the present disclosure.

For example, the robot 100 shown in the figures in the present disclosure is the single-arm vertical articulated robot. However, instead of this, the robot 100 may be a horizonal articulated robot (a SCARA robot) or a double-arm robot including two arms.

Contents derived from the embodiments are described below.

A robot includes: a robot main body section including a base including a housing and a robot arm coupled to the base, the robot main body section being sealed; a driving section provided on an inside of the robot arm and configured to drive the robot arm; a control board provided on an inside of the base; a power supply board provided on the inside of the base and configured to supply electric power to the control board; a driving board provided on the inside of the robot arm and configured to drive the driving section based on a command of the control board; a fan configured to stir gas on an inside of the robot main body section; and a heat sink provided on an inner wall of the housing.

With this configuration, it is possible to discharge heat generated from the control board and the power supply board to the outside of the base with the stirring of the gas in the internal space of the base by the fan. By stirring the gas in the internal space of the base, it is possible to circulate the gas and reduce a state in which temperature locally rises in the internal space.

In the robot, the fan may overlap the heat sink in an axial direction of a rotation axis of the fan.

With this configuration, it is possible to efficiently blow the gas against the heat sink from the fan. Therefore, it is possible to improve heat radiation efficiency of the heat sink.

In the robot, a wind tunnel section including an opening in the axial direction of the rotation axis and covering the control board or the power supply board may be provided in the base, and the fan may overlap the opening in a plan view in the axial direction of the rotation axis.

With this configuration, it is possible to form an air duct to cover the control board and the power supply board that generate heat. Therefore, it is possible to efficiently lead the gas in the internal space of the base stirred by the fan to the control board and the power supply board.

In the robot, the heat sink may include a tabular section and a plurality of projecting sections projecting from the tabular section, and the plurality of projecting sections may be radially arranged.

With this configuration, when the gas is blown by the fan, movement (a flow) of the gas is not blocked by the projecting sections. Therefore, it is possible to efficiently stir the gas in the internal space of the base.

In the robot, the fan may overlap a heat generating section provided on the control board or the power supply board in the axial direction of the rotation axis and blow the gas against the heat generating section.

With this configuration, the gas can be blown against the heat generating section by the fan. Therefore, it is possible to hit the gas, wind speed of which is increased by the fan, against the heat generating section. It is possible to efficiently cool the heat generating section.

What is claimed is:

1. A robot comprising:
    a robot main body section including a base and a robot arm coupled to the base and including a sealed internal space;
    a driving section provided on an inside of the robot arm and configured to drive the robot arm;
    a control board provided on an inside of the base;
    a power supply board provided on the inside of the base and configured to supply electric power to the control board;
    a driving board provided on the inside of the robot arm and configured to drive the driving section based on a signal from the control board;
    a fan configured to stir gas on an inside of the robot main body section; and
    a heat sink provided on the inside of the base.

2. The robot according to claim 1, wherein the fan overlaps the heat sink in a plan view from an axial direction of a rotation axis of the fan.

3. The robot according to claim 2, wherein
    a wind tunnel section including an opening in the axial direction of the rotation axis and covering the control board or the power supply board is provided in the base, and
    the fan overlaps the opening in the plan view from the axial direction of the rotation axis.

4. The robot according to claim 2, wherein
    the heat sink includes a tabular section and a plurality of projecting sections projecting from the tabular section, and
    the plurality of projecting sections are radially arranged.

5. The robot according to claim 1, wherein the fan overlaps a heat generating section provided on the control board or the power supply board in a plan view from an axial direction of a rotation axis.

* * * * *